United States Patent [19]

Flowers et al.

[11] 4,187,599
[45] Feb. 12, 1980

[54] SEMICONDUCTOR DEVICE HAVING A TIN METALLIZATION SYSTEM AND PACKAGE CONTAINING SAME

[75] Inventors: Dervin L. Flowers; Richard L. Greeson, both of Scottsdale; V. Louise Rice, Phoenix, all of Ariz.

[73] Assignee: Motorola, Inc., Schaumburg, Ill.

[21] Appl. No.: 908,037

[22] Filed: May 22, 1978

Related U.S. Application Data

[63] Continuation of Ser. No. 734,794, Oct. 22, 1976, abandoned, which is a continuation of Ser. No. 567,960, Apr. 14, 1975, abandoned.

[51] Int. Cl.² .......................................... B01J 17/00
[52] U.S. Cl. ....................................... 29/588; 29/590; 228/188
[58] Field of Search ................. 29/588, 590; 228/123, 228/124, 188

[56] References Cited

U.S. PATENT DOCUMENTS

| | | | |
|---|---|---|---|
| 2,945,285 | 7/1960 | Jacobs | 357/71 X |
| 3,241,931 | 3/1966 | Triggs et al. | 357/67 X |
| 3,249,470 | 5/1966 | Naake | 357/71 X |
| 3,436,614 | 4/1969 | Nagastv et al. | 357/67 X |
| 3,447,236 | 6/1969 | Hatcher | 29/588 X |
| 3,609,471 | 9/1971 | Scace | 228/124 |
| 3,737,380 | 6/1973 | Bachmeier | 357/71 X |
| 3,844,029 | 10/1974 | Dibvgnara | 29/588 |
| 3,996,602 | 12/1976 | Goldberg et al. | 357/72 |

Primary Examiner—Charlie T. Moon
Assistant Examiner—K. J. Ramsey
Attorney, Agent, or Firm—Lowell E. Clark

[57] ABSTRACT

An improved metallization system for semiconductor substrates comprising successive layers of at least one barrier metal and tin is disclosed. A semiconductor package comprising a housing of impervious material, a semiconductor device having the metallization system of this invention disposed in the housing and conductor means bonded to the tin on the semiconductor device is also disclosed. The system is of particular usefulness in double stud diode packages.

3 Claims, 5 Drawing Figures

STEPS 1,2

STEPS 3,4

STEP 5

STEPS 6,7

SEMICONDUCTOR DEVICE HAVING A TIN METALLIZATION SYSTEM AND PACKAGE CONTAINING SAME

This is a continuation of application Ser. No. 734,794, filed Oct. 22, 1976, which is a continuation of application Ser. No. 567,960, filed Apr. 14, 1975, both abandoned.

BACKGROUND OF THE INVENTION

This invention relates to a semiconductor substrate having an improved metallization system disposed thereon, to semiconductor packages comprising semiconductor devices having the improved metallization system of this invention and to a method for making such semiconductor packages.

Semiconductors generally consist of a single crystal element of silicon which has an internal PN junction and has plated metal contacts at surfaces parallel to the PN junction. Electrical connections are made to the metal contacts and often the connections are part of the housing which forms an enclosure for the semiconductor device. Metal coatings have been required on the semiconductor devices for various reasons. Thus, in those cases where electrical connectors are soldered to the device, the solder materials do not wet silicon well enough to permit soldering the connectors directly to the silicon material. In packages where contacts are made directly to conductive studs, the metal coatings are required to provide an electrical contact by pressure alone.

Various metallization systems are used in the semiconductor industry but these known systems are characterized by a variety of drawbacks. For example, one widely used system is the chromium-silver-gold metallization used on numerous devices. This system suffers from reproducibility problems when evaporated onto silicon substrates by conventional evaporation equipment. Furthermore, at high temperatures, e.g., 700° C. or above, gold migrates into silicon therefore requiring a thick layer of chromimum as a barrier. Double stud whiskerless diode packages have become common in recent years. In these packages, pressure contact is made between the conductive studs and the device inside an impervious housing. However, the high temperatures necessary to seal the package create problems because of the unmatched coefficients of thermal expansion of the components of the package. Thus, the studs pull apart from the diode in operation resulting in high temperature opens and device failure.

SUMMARY OF THE INVENTION

This invention is directed to a semiconductor substrate having disposed thereon successive layers of at least one barrier metal and tin. The metallization system is preferably placed on both sides of the semiconductor device and can optionally include a layer of titanium disposed between the silicon and and the barrier metal layer. Furthermore, either the barrier metal or the tin disposed over the junction can be formed into a bump, that is a protuberance from the surface of the device. The invention also relates to a semiconductor package comprising an impervious housing, a semiconductor device having the aforementioned metallization system disposed thereon in the housing and conductor means extending outwardly from the housing, the conductor means being bonded to the tin on the device.

It has been found that the metallization system of this invention provides an excellent metallurgical bond to electrical contacts. Because of this bond, the packages of this invention are not subject to high temperature opens. Furthermore, the packages of this invention are improved in forward current carrying capacity.

DETAILED DESCRIPTION OF THE INVENTION

Figure 1:
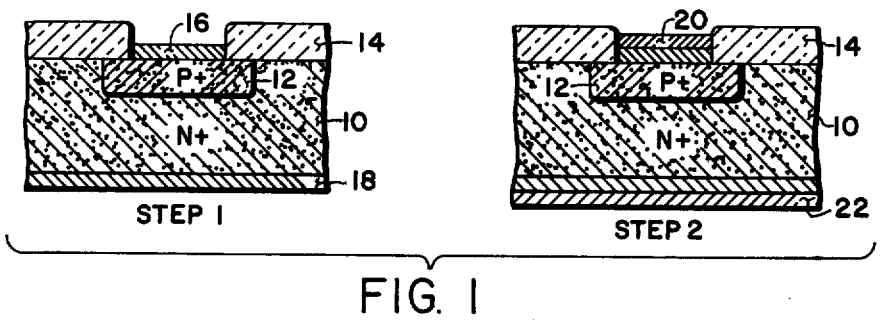
FIG. 1 illustrates two different steps shown in cross sectional view for providing the metallization system of this invention.

Referring to FIG. 1, step one illustrates a substrate 10 of N+ conductivity type which as been formed by conventional semiconductor wafer fabrication techniques. A doped P+ region 12 has been formed by epitaxy, diffusion or ion implantation techniques and forms a PN junction within the substrate. An insulating masking layer 14 has been formed on the surface of the substrate. Preferably, this insulating masking layer is made of silicon dioxide which is thermally grown or deposited and then opened over the PN junction by means of conventional photolithographic masking and etching techniques. Then, in accordance with this invention, a layer of palladium 16 is deposited in the opening over doped P+ region 12 and a layer of palladium 18 is deposited on the back surface of semiconductor body 10.

The palladium barrier layers are provided by conventional evaporation techniques. Thus, the substrate is loaded into a commercial evaporator, the system is evacuated, the substrate heated, and palladium evaporated, generally at 950°–1050° C. at a pressure of $10^{-6}$ to $10^{-8}$ torr. The metal is evaporated on one surface, the substrate removed and repositioned, and evaporation on the opposite surface carried out. The palladium is removed from the top surface of the device except for the region indicated by numeral 16 by conventional photolithographic techniques. Preferably layers of palladium 500 to 5000 Å thick are provided over the PN junction and on the back surface of the substrate.

In step two, layers 20 and 22 of tin are electrolytically plated over the palladium layers. Thus, the substrate is placed in a tin plating bath containing a tin anode and a point contact is applied to layer 18. The substrate is generally plated at 200–1600 milliamps at 0.2 volts for 0.5 to 4 minutes, resulting in a layer of tin 22 which is 0.4 to 1.2 microns thick. This amount of tin is sufficient to insure soldering of the back of the substrate to a slug during subsequent packaging of the device. However, thick layers on the back of the substrate are to be avoided since they preclude a clean scribe if the substrate is broken into individual devices. This can present a problem since sufficient tin is needed over the PN junction to insure good ohmic contact. Occasionally because of a resistance drop to the front of the substrate, layer 20 is only 0.1 to 0.2 microns thick. In such instances, 4 to 10 volt, 60 cycle AC potential is superimposed on the DC potential and a thickness of 0.4 to 2.0 microns is obtained for layer 20.

Figure 2:
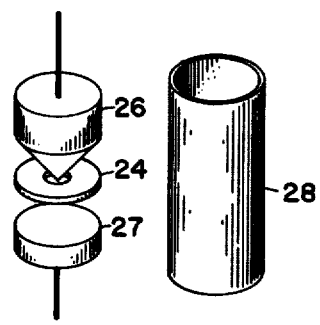
FIG. 2 is an exploded perspective view showing the components of a package according to this invention employing the semiconductor device made according to FIG. 1.

In FIG. 2, a diode 24 made according to the steps outlined in FIG. 1 is positioned between point contact stud 26 and flat contact stud 27. These studs are conventional and may be copper, silver, copper clad iron-nickel alloy, silver plated molybdenum, etc. Housing 28 may be any type of material that is impervious to liquids and atmospheric gases. For example, plastics, glasses, etc., may be used. The alkali-free glasses generally used in packaging diodes have high sealing temperatures, that is, temperatures of 500° to 800° C. Exemplary of these glasses is the 7061AF lead borosilicate glass sealing at 730° C. marketed by Corning Co. The assembly of diode 24 and contact studs 26 and 27 is placed within housing 28 and sealed by heating to the appropriate temperature for the housing material, resulting in a package wherein the contact studs are bonded to the tin on the front and back surfaces of diode 24.

Figure 3:
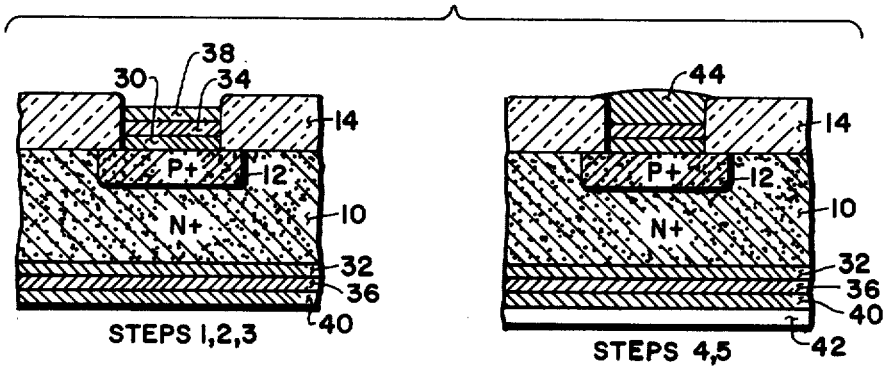
FIG. 3 illustrates in two cross sectional views five steps in applying a metallization system according to another embodiment of this invention.

In FIG. 3 a semiconductor body of N+ conductivity type having a PN junction and an insulating masking layer is provided as described in FIG. 1. In this embodiment of the invention, two different layers of barrier metals are provided. Thus, layer 30 of chromium is provided on the junction and layer 32 of chromium on the back of the semiconductor body. Then a layer 34 of silver is provided over chromium layer 30 and a layer 36 of silver is provided over chromium layer 32. These layers are provided by any conventional technique, preferably by evaporation, and are generally from 500 to 5000 Å thick. Subsequently, layers 38 and 40 of tin are plated as described with respect to FIG. 1. Then, in step four, the semiconductor body is removed from the plating bath and a conventional resist layer 42 is applied to the back surface. After baking and drying to set layer 42, the semiconductor body is returned to the tin plating bath and point contact to tin layer 40 established by piercing layer 42. Then additional tin is plated in step 5 in order to provide the thicker layer indicated by 44. After this step the total thickness of the tin on the junction region is generally from 1.5 to 2.5 microns. It is preferred to employ this additional plating step and to provide the additional tin for the ohmic contact.

Figure 4:
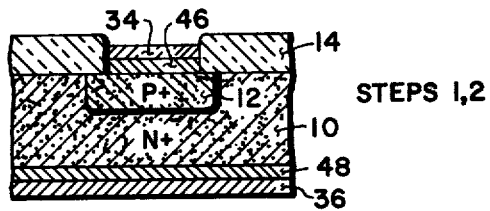
FIG. 4 shows four cross sectional views illustrating seven steps in applying the metallization system of this invention according to a further embodiment thereof.
Figure 4:
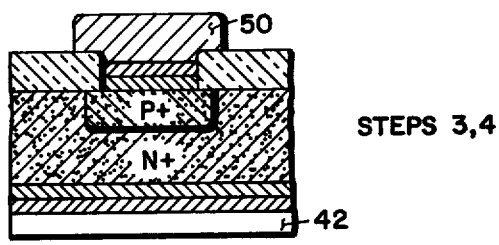
Figure 4:
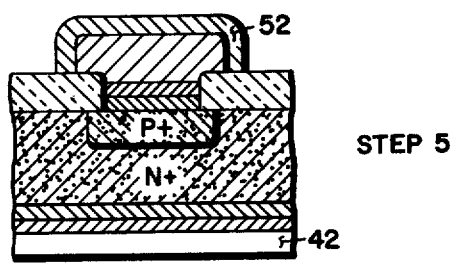
Figure 4:
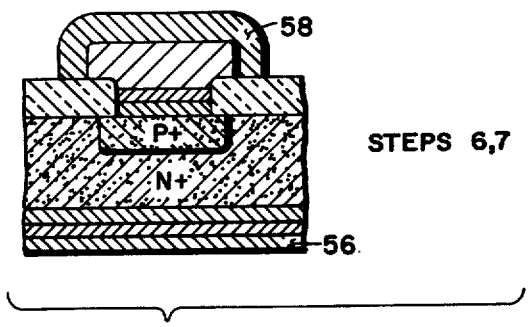

In FIG. 4 layers 46 and 48 of titanium are provided by evaporation in step one. Titanium is a sealant and is useful in promoting adhesion of the barrier metal to the semiconductor body. In step two, layers 34 and 36 of silver are evaporated onto the titanium layers. Again, these layers are from 500 to 5000 Å thick. Then in step three the semiconductor body is removed from the plating bath and a resist layer 42 is applied as described with respect to FIG. 3. In step four, a silver bump 50 is electrolytically deposited over the PN junction, the bump is generally from 25 to 45 microns thick. The silver bump is employed on devices which are to be packaged with flat head studs as described hereinafter. Then in step five, a layer of tin 52 is plated over the bump. The resist layer 42 is removed in step six and the semiconductor body returned to the tin plating bath. In step seven, layer 56 of tin is provided on the back of the semiconductor body and additional tin is grown over silver bump 50 resulting in a final layer of tin 58 having a thickness of 1.5 to 2.5 microns. Silver bump 50 holds its shape when the tin melts during the soldering step in the package assembly. Furthermore, the bump is sufficiently high to allow contact to the flat head studs.

Figure 5:
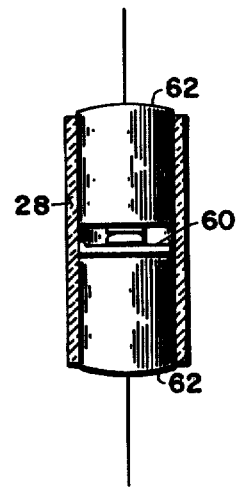
FIG. 5 is a cross sectional view of a sealed package according to this invention employing as a semiconductor device the device illustrated in FIG. 4.

The application of the bump construction is illustrated in FIG. 5 where a diode 60 having a bump is packaged with flat head studs 62 and encapsulated in housing 28 in a similar manner as described with respect to FIG. 2.

While the invention has been described with reference to specific metallization systems, it should be recognized that any barrier metal system can be employed between the semiconductor substrate and the tin layer. By the term "barrier metal" in the claims and specification herein is meant any metal that prevents deleterious impurities from reaching a semiconductor body. Exemplary barrier metal systems include aluminum-palladium, titanium-palladium, chromium-silver, titanium-gold, palladium, titanium-silver, tungsten, platinum, etc.

Furthermore, although the barrier metals have been deposited by specific techniques for purpose of illustration, any appropriate means for depositing metals can be employed depending upon the particular metal used. While the drawings indicate that the back of the semiconductor body has substantially the same metallization system as that providing the ohmic contact, this is merely a processing convenience. Thus, the back could be coated with gold or chrome-gold if a good metallurgical bond thereto is not required. Furthermore, different metals could be used for barrier layers on the front and rear surfaces of the semiconductor body.

Also, it should be recognized that the system is applicable to any device requiring metallization.

It is intended that tin alloys can be used in the practice of this invention. For example, a tin-lead alloy could be deposited. Thus, by the term "tin" in the claims and specification herein is meant tin or any alloy containing at least 30 percent by weight tin.

The invention will now be described in detail in terms of metallizing a number of diodes in accordance with one embodiment of the invention. Silicon wafers having PN junctions and 2000–20,000 Å thick surface layers of thermal oxide covered with 500 to 2000 Å thick layers of gettered oxide were placed in an IVI 400 Model No. 303030 evaporator sold by International Vacuum, Inc., Pembroke, Massachusetts. The wafers were heated to 200° C. and 700 Å of titanium deposited on both sides thereof. Subsequently, 8000 Å thick silver layers were deposited on top of the titanium layers. The wafers were removed from the evaporator and conventional steps of photoresisting, masking and etching were carried out to produce the desired number of devices on the wafers. Then the clean wafers were placed in a conventional silver plating bath made by dissolving 17.5 grams per liter of silver nitrate in water heated to 42° C., and then adding 67.5 grams per liter of potassium cyanide and 17.5 grams per liter potassium carbonate. The bath was operated at 42° C. and the wafers plated at 1000 milliamps (0.2 volts) for 12 minutes. Substantially cylindrical bumps 10 microns high were formed. The wafers were then removed from the bath, rinsed, dried and placed in a tin plating bath comprising 40 grams per liter of tin as stannous from stannous sulfate, 50 grams per liter of 36 N sulfuric acid, 15 grams per liter of Igepon CN (the reaction product of palmitic acid and cyclohexytaurine sold by Antara Chemicals, a division of General Dyestuff Corp.), 1 gram per liter hydroquinone and 2 grams per liter gelatin. The bath was heated to 15° to 30° C. The wafers were placed at 800 milliamps (0.2 volts) with a superimposed ten volt, 60 cycle AC ripple for two minutes. A 0.8 microns layer of tin was on the backside of the wafers, and as well, a 0.6 micron layer of tin on the front of the wafers. Then the back of the wafers were coated with photoresist, baked and dried. After returning to the plating bath and affixing the point contact to the rear surface, additional tin was plated for four minutes at 400 milliamps with a 10 volt, 60 cycle AC potential superimposed on the DC voltage thus effecting a total layer of 1.4 microns thickness on the bumps and a layer 0.8 microns on the back of the wafers. After conventional laser scribing, the individual diodes were bonded to silver plated molybdenum tapered slugs during furnace sealing of the diodes in glass cases. The sealed diodes showed no high temperature opens and experienced an improvement in forward current carrying capacity.

Although the invention has been described in connection with certain preferred embodiments, it is not intended that the invention be limited thereto. Thus, it is intended that the invention cover all alternatives, arrangements, equivalents, and embodiments as may be included in the scope of the following claims.

We claim:

1. A method of encapsulating a semiconductor device comprising:

providing a semiconductor device comprising a body of a first conductivity type, having first and second major surfaces, a region of second conductivity type in said body at a first major surface and forming a PN junction at said first surface, and an insulating layer covering said body and said PN junction at said first surface, a barrier metal on said second region at said first surface, and a barrier metal on said second major surface;

selectively electroplating a layer of silver on said barrier metal using said insulator as a mask, said silver forming a bump extending above said insulator;

selectively electroplating a layer of tin on said silver bump using said insulating layer as a mask;

providing a glass housing and conductor means for making electrical contacts external to said housing; and heating said assembly to metallurgically bond said conductor means to said tin layer and simultaneously said semiconductor device in said glass housing.

2. The process of claim 1 further including simultaneously electroplating a layer of tin over said silver bump and over said barrier metal on said second major surface by providing an A.C. component during said electroplating.

3. The method of claims 1 or 2, further including masking the barrier metal on said second major surface during the electroplating of said silver bump.

* * * * *